(12) United States Patent
Chen et al.

(10) Patent No.: US 8,900,900 B2
(45) Date of Patent: Dec. 2, 2014

(54) ARRAY SUBSTRATE AND MANUFACTURING METHOD THEREOF

(71) Applicant: AU Optronics Corp., Hsin-Chu (TW)

(72) Inventors: Ming-Yao Chen, Hsin-Chu (TW); Pei-Ming Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 91 days.

(21) Appl. No.: 13/772,346

(22) Filed: Feb. 21, 2013

(65) Prior Publication Data
US 2014/0138714 A1 May 22, 2014

(30) Foreign Application Priority Data
Nov. 19, 2012 (TW) .............................. 101143093 A

(51) Int. Cl.
H01L 33/48 (2010.01)
H01L 33/08 (2010.01)
H01L 21/77 (2006.01)

(52) U.S. Cl.
CPC ...................................... H01L 21/77 (2013.01)
USPC ............................................ 438/34; 438/128

(58) Field of Classification Search
CPC ....................................................... H01L 21/77
USPC ................................................... 438/34, 128
See application file for complete search history.

(56) References Cited

U.S. PATENT DOCUMENTS

| 6,479,398 | B1 * | 11/2002 | Chen et al. ..................... 438/734 |
| 2008/0116516 | A1 * | 5/2008 | Wang et al. .................... 257/347 |
| 2009/0148973 | A1 * | 6/2009 | Huang et al. .................... 438/30 |
| 2009/0225249 | A1 * | 9/2009 | Wang et al. ..................... 349/43 |
| 2010/0245735 | A1 * | 9/2010 | Xie et al. ....................... 349/110 |
| 2011/0127531 | A1 * | 6/2011 | Kim .................................. 257/59 |
| 2011/0248274 | A1 * | 10/2011 | Kim et al. ......................... 257/59 |
| 2012/0205646 | A1 * | 8/2012 | Cho et al. ......................... 257/43 |
| 2013/0306972 | A1 * | 11/2013 | Ryu et al. ......................... 257/59 |
| 2014/0120658 | A1 * | 5/2014 | Yang et al. ..................... 438/104 |

FOREIGN PATENT DOCUMENTS

JP 2011029304 2/2011

OTHER PUBLICATIONS

Huang et al., Title of Invention: Array substrate structure of display panel and method of making the same, U.S. Appl. No. 13/609,272, filed Sep. 11, 2012.

* cited by examiner

Primary Examiner — Alexander Ghyka
(74) Attorney, Agent, or Firm — Winston Hsu; Scott Margo

(57) ABSTRACT

A manufacturing method of an array substrate includes the following steps. A substrate having pixel region and a peripheral region is provided. A plurality of pixel structures are formed in the pixel region, wherein at least one of the pixel structures is formed by the following steps. A gate electrode, a gate insulating layer, and a source electrode and a drain electrode are formed. A patterned semiconductor layer including a first semiconductor pattern and a second semiconductor pattern is formed. The second semiconductor pattern covers a portion of the drain electrode. A first passivation layer is formed. The first passivation layer has a first opening exposing a portion of the second semiconductor pattern. A transparent conductive pattern is formed on the first passivation layer, and the transparent conductive pattern is electrically connected to the second semiconductor pattern through the first opening.

11 Claims, 11 Drawing Sheets

ARRAY SUBSTRATE AND MANUFACTURING METHOD THEREOF

BACKGROUND OF THE INVENTION

1. Field of the Invention

The present invention relates to an array substrate and a manufacturing method thereof, and more particularly, to an array substrate and a manufacturing method having improved process stability and yield.

2. Description of the Prior Art

Flat display apparatus such as a liquid crystal display (LCD) apparatus has been noticed in recent years as a display apparatus substituting the cathode ray tube (CRT) display apparatus. This is because LCD apparatus has advantages of small size, low radiation, and low power consumption. Furthermore, the trend toward higher resolution requires more thin film transistors (TFT) and thus space for forming the TFT is getting smaller and smaller. Meanwhile, photo-etching-process (hereinafter abbreviated as PEP) is increased for improving aperture ratio and TFT performance.

However, increasing PEP brings more problems, for example, the alignment issue between layers and completeness issue of elements being protected during PEP and of materials being removed by PEP. Consequently, process complexity is increased while process stability is decreased. Therefore, an array substrate and a manufacturing method thereof having improved process stability are still in need.

SUMMARY OF THE INVENTION

It is one of the objectives of the invention to provide an array substrate and a manufacturing method thereby improving process stability and yield.

To achieve the purposes described above, an embodiment of the disclosure provides a manufacturing method of an array substrate. The method comprises the following steps. First, a substrate is provided. The substrate includes a pixel region and a pixel region adjacent to the peripheral region. Next, a plurality of pixel structures is formed in the pixel region, and at least one of the pixel structures is formed by the following steps. A patterned first metal layer, a gate insulating layer, and a patterned second metal layer are formed on the substrate. The patterned first metal layer includes a gate electrode, and the patterned second metal layer includes a source electrode and a drain electrode. Then, a patterned semiconductor layer is formed. The patterned semiconductor layer includes a first semiconductor pattern and a second semiconductor pattern. The first semiconductor pattern substantially corresponds to the gate electrode and covers a portion of the source electrode and a portion of the drain electrode. The second semiconductor pattern covers a portion of the drain electrode. Subsequently, a first passivation layer is formed on the substrate. The first passivation layer has a first opening, and the first opening exposes a portion of the second semiconductor pattern. Next, a first patterned transparent conductive layer is formed on the first passivation layer. The first patterned transparent conductive layer includes a transparent conductive pattern, and transparent conductive pattern is electrically connected to the second semiconductor pattern through the first opening.

To achieve the purposes described above, an embodiment of the disclosure provides an array substrate. The array substrate includes a substrate and a plurality of pixel structures. The substrate includes a pixel region and a peripheral region adjacent to the pixel region, and the pixel structures are disposed in the pixel region. At least one of the pixel structures includes a gate electrode, a gate insulating layer, a source electrode and a drain electrode, a patterned semiconductor layer, a first passivation layer, and a transparent conductive pattern disposed in the pixel region of the substrate. The patterned semiconductor layer includes a first semiconductor pattern and a second semiconductor pattern. The first semiconductor pattern substantially corresponds to the gate electrode and covers a portion of the source electrode and a portion of the drain electrode. The second semiconductor pattern covers a portion of the drain electrode. The first passivation layer is disposed on the patterned semiconductor layer and has a first opening exposing a portion of the second semiconductor pattern. The transparent conductive pattern is disposed on the first passivation layer and electrically connected to the second semiconductor pattern through the first opening.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic diagrams illustrating of an array substrate and a manufacturing method thereof provided by a first embodiment of this disclosure, wherein FIG. 1 is a plane view of the array substrate provided by the first embodiment, FIG. 2 is a schematic diagram illustrating a portion of the array substrate provided by the first embodiment, and FIGS. 3-6 are schematic diagrams illustrating the manufacturing method of the array substrate provided by the first embodiment of this disclosure and are cross-sectional views taken along lines $A_1$-$A_1'$, $B_1$-$B_1'$, and $C$-$C_1'$ of FIG. 2.

FIG. 8 and FIG. 9 are schematic diagrams illustrating an array substrate and a manufacturing method thereof provided by a second embodiment of this disclosure, wherein FIG. 9 is a cross-sectional view taken along lines $A_2$-$A_2'$ and $B_2$-$B_2'$ of FIG. 8.

DETAILED DESCRIPTION

To provide a better understanding of the present invention, the preferred embodiments will be made in detail. The preferred embodiments of the present invention are illustrated in the accompanying drawings with numbered elements. In addition, the terms such as "first" and "second" described in the present invention are used to distinguish different components or processes, which do not limit the sequence of the components or processes.

Figure 1:
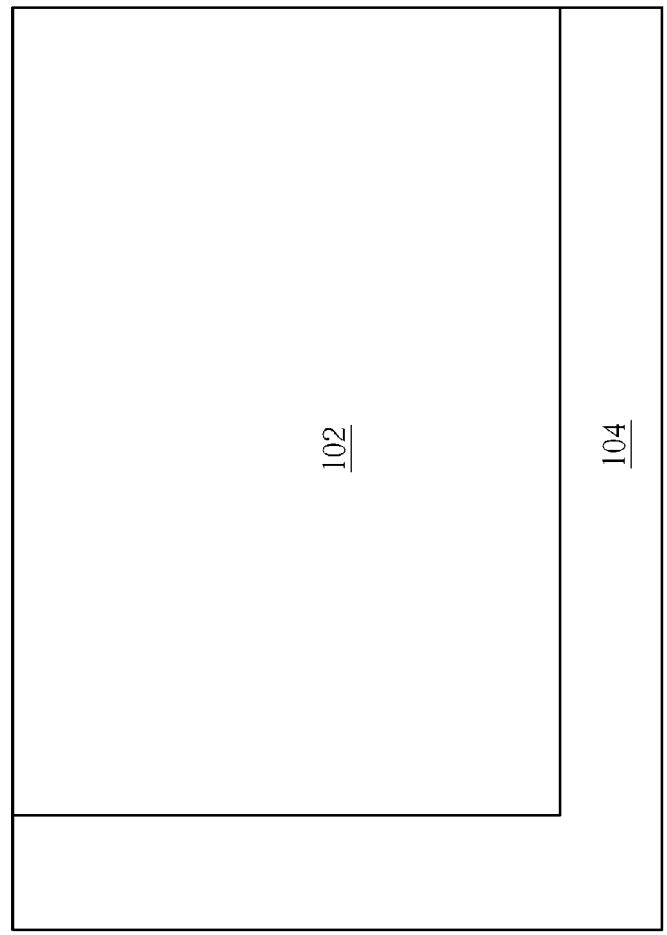
Figure 2:
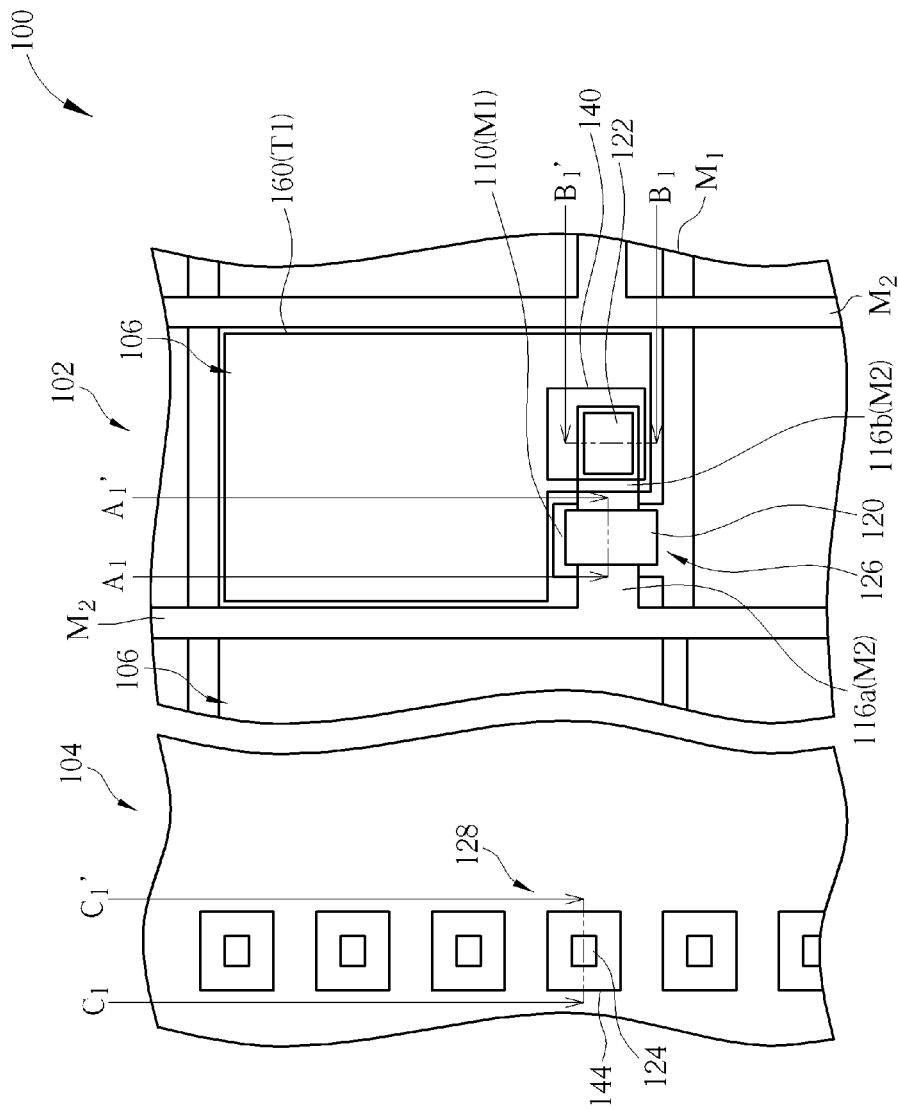

Please refer to FIGS. 1-7, which are schematic diagrams illustrating an array substrate and a manufacturing method thereof provided by a first embodiment of this disclosure. It should be noted that FIG. 1 is a plane view of the array substrate provided by the first embodiment, FIG. 2 is a schematic diagram illustrating a portion of the array substrate provided by the first embodiment, and FIGS. 3-6 are schematic diagrams illustrating the manufacturing method of the array substrate provided by the first embodiment of this disclosure. Furthermore, FIGS. 3-6 are cross-sectional views taken along lines $A_1$-$A_1'$, $B_1$-$B_1'$, and $C_1$-$C_1'$ of FIG. 2. The array substrate and the manufacturing method thereof is exemplarily embodied as a liquid crystal display (LCD) panel, such as horizontal electric field type liquid crystal display panel, vertical electric field type liquid crystal display panel, optically compensated bend (OCB) liquid crystal display panel, cholesteric liquid crystal display, blue phase liquid crystal display, or any suitable liquid crystal display panel, but not limited to this. The array substrate provided by the disclosure can be exemplarily embodied as a non-self-luminous display panel includes, for example but not limited to, electro-phoretic display panel, electrowetting display panel, or any suitable non-self-luminous display panel. The array substrate provided by the disclosure can also be embodied as a self-luminous display panel includes, for example but not limited to, plasma display panel, field emission display panel, or any suitable self-luminous display panel. According to the manufacturing method of an array substrate provided by the disclosure, a substrate 108 (shown in FIG. 3) is first provided. The substrate 108 includes a pixel region 102 and a peripheral region 104 adjacent to the pixel region 102. The pixel region 102 is used to display the images and therefore also taken as a display region. The peripheral region 104 is used to accommodate wirings (not shown), testing lines (not shown) or driving circuits such as data line driving circuits and scan line driving circuits (not shown). The substrate 108 is a transparent substrate exemplarily including a rigid substrate such as glass substrate or quartz substrate, or including a flexible substrate such as plastic substrate, but not limited to this. As shown in FIG. 2, a plurality of pixel structures 106 is formed in the pixel region 102.

Figure 3:
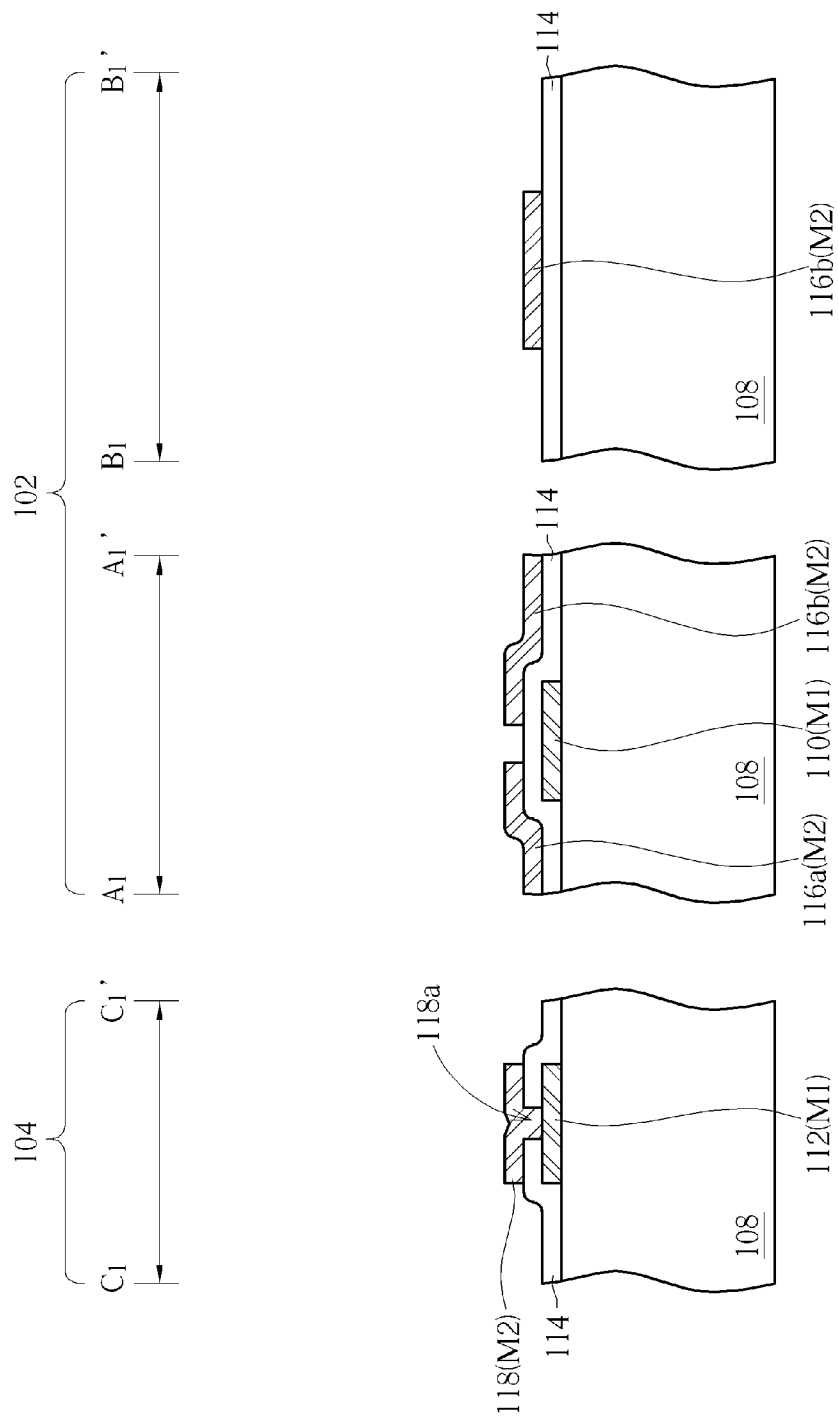

As shown in FIG. 3, a patterned first metal layer M1 is formed on the substrate 108. The patterned first metal layer M1 includes a gate electrode 110 disposed in the pixel region 102. The patterned first metal layer M1 selectively includes a connecting layer 112 disposed in the peripheral region 104. It is well-known to those skilled in the art that the connecting layer 112 can be formed in or omitted from the peripheral region 104 depending on different requirements to the product. Therefore the connecting layer 112 is only exemplarily provided and depicted in FIG. 3, but not limited thereto. Subsequently, a gate insulating layer 114 is formed on the substrate 108 to cover the gate electrode 110 and the connecting layer 112. The patterned first metal layer M1 can be a single layer or a multiple layer, and include any suitable materials with superior conductivity such as metal, metal alloy or combination thereof. The gate insulating layer 114 can be made of organic or inorganic insulating material such as silicon oxide, silicon nitride, or silicon oxynitride, but not limited to this. Next, a patterned second metal layer M2 is formed on the gate insulating layer 114. The patterned second metal layer M2 includes a source electrode 116s and a drain electrode 116b disposed in the pixel region 102. Furthermore, the patterned second metal layer M2 includes another connecting layer 118 disposed in the peripheral region 104. It should be noted that in a case that an electrical connection is required between the connecting layer 112 and the connecting layer 118 in the peripheral region 104, an opening 118a exposing a portion of the connecting layer 112 is formed in the gate insulating layer 114 in the peripheral region 104 before forming the patterned second metal layer M2. Accordingly, the connecting layer 118 is electrically connected to the connecting layer 112 through the openings 118a. The patterned second metal layer M2 can be a single layer or a multiple layer, and include any suitable materials with superior conductivity such as metal, metal alloy or combination thereof.

Figure 4:
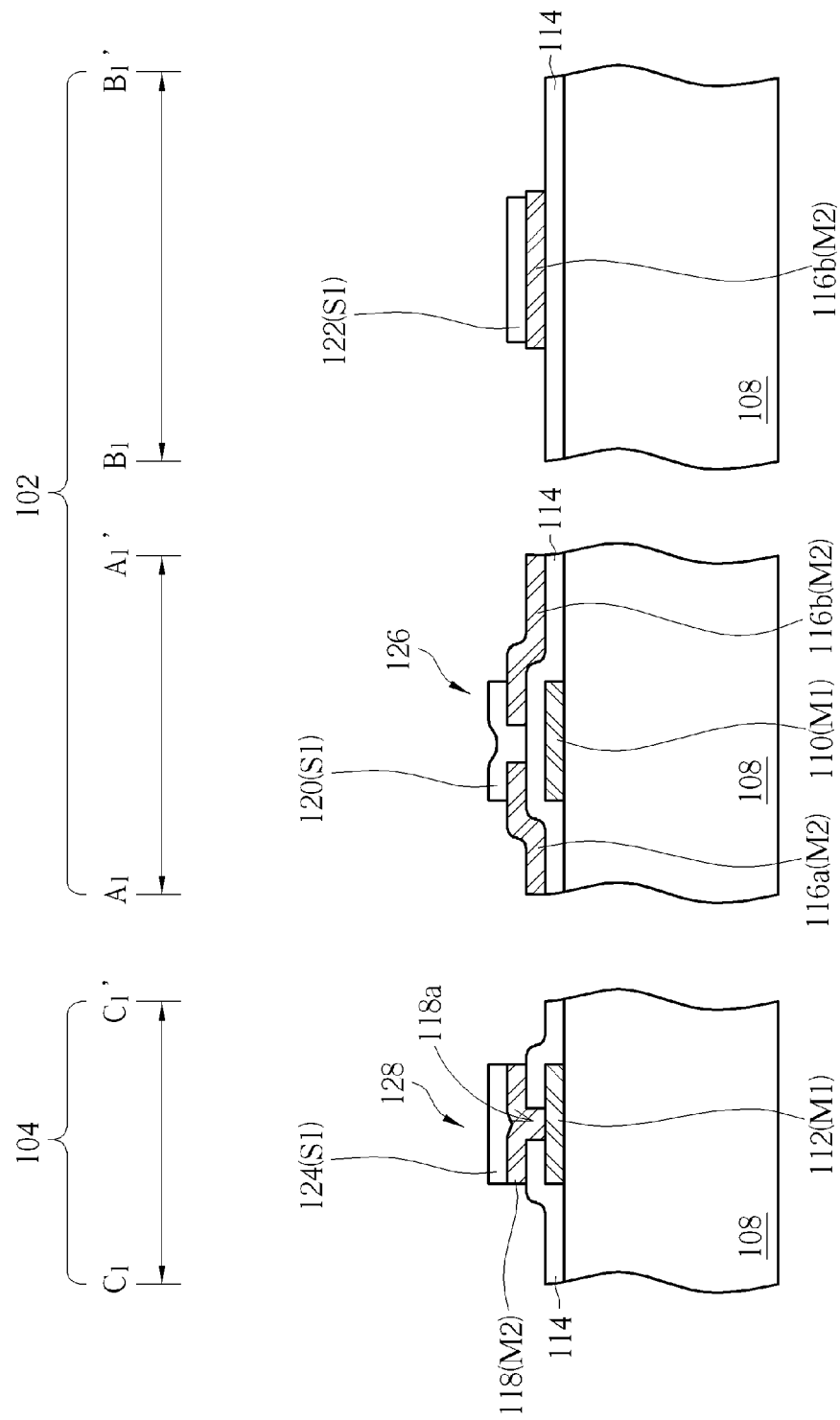

Please refer to FIG. 4. After forming the patterned second metal layer M2, a patterned semiconductor layer Si is formed on the substrate 108. As shown in FIG. 4, the patterned semiconductor layer Si includes a first semiconductor pattern 120, a second semiconductor pattern 122, and a third semiconductor pattern 124. The first semiconductor pattern 120 and the second semiconductor pattern 122 are disposed in the pixel region 102. The first semiconductor pattern 120 substantially corresponds to the gate electrode 110 and covers a portion of the source electrode 116a and a portion of the drain electrode 116b. The second semiconductor pattern 122 covers a portion of the drain electrode 116b. As shown in FIG. 2 and FIG. 4, the first semiconductor pattern 120 and the second semiconductor pattern 122 are physically spaced apart from each other. Furthermore, the third semiconductor pattern 124 is physically spaced apart from the first semiconductor pattern 120 and the second semiconductor pattern 122. In this embodiment, the patterned semiconductor layer Si can be made of a patterned oxide semiconductor layer such as an indium gallium zinc oxide (IGZO) layer, an indium zinc oxide (IZO) layer, an indium gallium oxide (IGO) layer, or a zinc oxide (ZnO) layer, but not limited to this. Accordingly, a thin film transistor 126 is constructed in the pixel region 102 by the gate electrode 110, the first semiconductor pattern 120, the source electrode 116a, and the drain electrode 116b while a connection structure 128 is constructed in the peripheral region 104 by the connecting layer 112, the connecting layer 118, and the third semiconductor pattern 124, as shown in FIG. 2 and FIG. 4. Since the elements for constructing the thin film transistor 126 and the connection structure 128 are well-known to those skilled in the art, those details are omitted in the interest of brevity.

Figure 5:
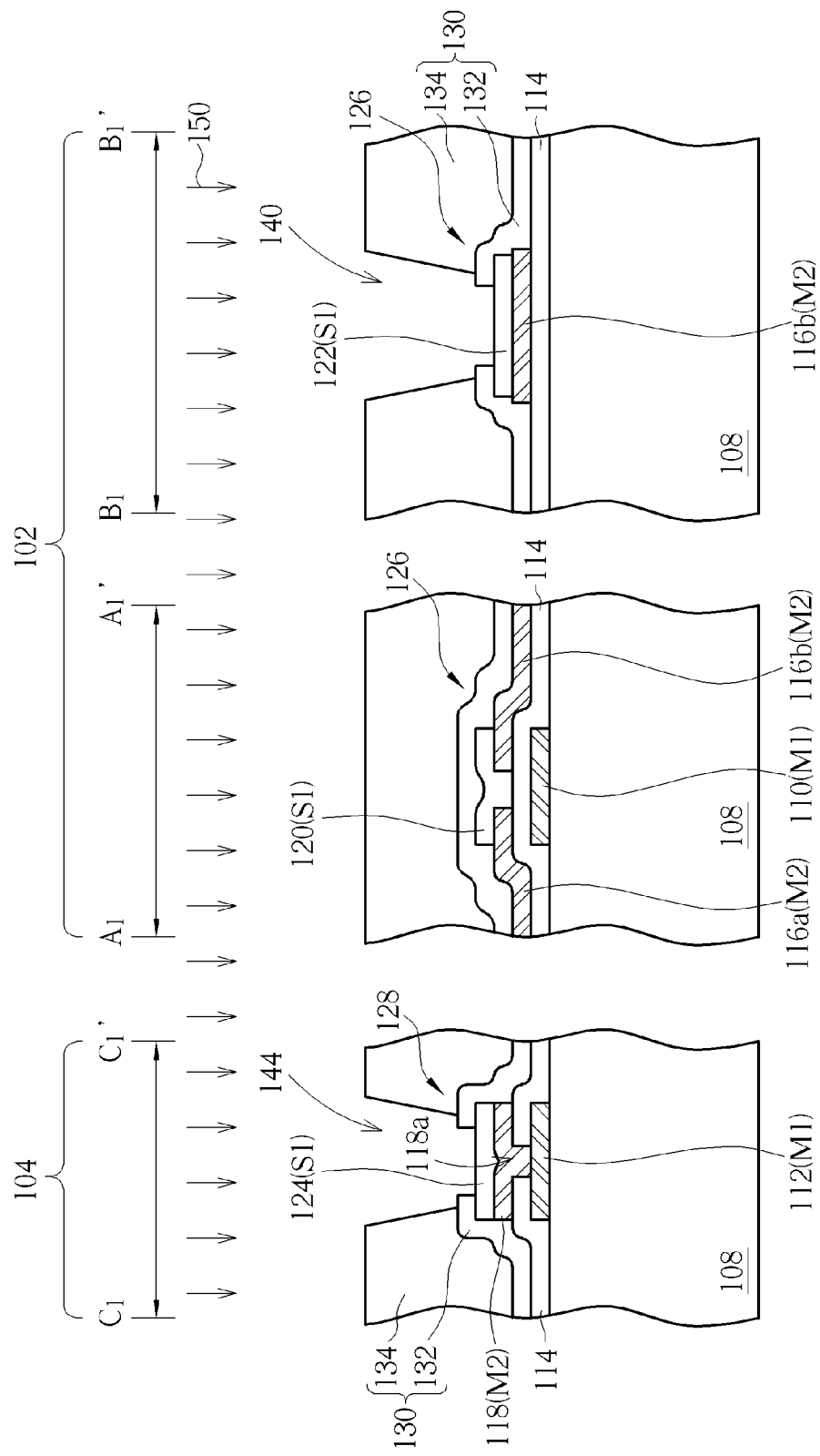

Please refer to FIG. 5. After forming the patterned semiconductor layer S1, a first passivation layer 130 is formed on the substrate 108. The first passivation layer 130 can be a single layer or a multiple layer and upwardly include an insulating layer 132 and a planarization layer 134 in sequence. As shown in FIG. 5, the insulating layer 132 covers the thin film transistor 126 and the connection structure 128, and the planarization layer 134 is disposed on the insulating layer 132. The insulating layer 132 can be made of inorganic insulating layer such as silicon nitride, silicon oxide, or aluminum oxide, and the planarization layer 134 can be made of organic insulating layer such as acrylic material, but both not limited to this. Next, a dry etching process is performed with, for example but not limited to, boron trichloride ($BCl_3$) and chlorine ($Cl_2$) to etch the first passivation layer 130. Consequently, a first opening 140 and a third opening 144 are formed in the first passivation layer 130. However, those skilled in the art would easily realize that the third opening 144 is selectively formed in the peripheral region 104. In other words, when the third opening 144 is not required in the peripheral region 104 according an alternative circuit design, only the first opening 140 is formed in the pixel region 102 in this embodiment. As shown in FIG. 5, the first opening 140 is formed in the pixel region 102 to expose a portion of the second semiconductor pattern 122, and the third opening 144 is formed in the peripheral region 104 to expose a portion of the third semiconductor pattern 124. It is also noteworthy that because the first passivation layer 130 is a multiple layer in accordance with this embodiment, different approaches can be involved for forming the first opening 140 and the third opening 144. In one example, an insulating material layer is formed and then patterned to form the insulating layer 132, and the planarization layer 134 is formed subsequently. In another example, an insulating material layer and a planarization material layer are sequentially formed and then patterned by a same PEP, and thus to form the insulating layer 132 and the planarization layer 134. In still another example, when the planarization layer 134 is made of photo-sensitive materials, a photolithography process is performed to pattern the photo-sensitive materials to form the planarization layer 134, and the planarization layer 134 is used as an etching mask during etching an insulating material layer exposed by the planarization layer 134. By any approaches mentioned above, the first opening 140 and the third opening 144 as shown in FIG. 5 are obtained. More important, during the dry etching process, the second semiconductor pattern 122 and the third semiconductor pattern 124 serve as etch stop layers and render protection to its underneath patterned second metal layer M2 (including the drain electrode 116b and the connecting layer 118). Therefore, the completeness of the drain electrode 116b and the connecting layer 118 is improved.

Please still refer to FIG. 5. After forming the first opening 140 and the third opening 144 in the first passivation layer 130, a surface treatment 150 is performed to the patterned semiconductor layer S1. In detail, the surface treatment 150, such as a plasma surface treatment, is performed to the exposed patterned semiconductor layer S1. For example, an argon (Ar) plasma surface treatment is used in accordance with this embodiment, but not limited to this. The surface treatment 150 is provided to improve conductivity of the second semiconductor pattern 122 exposed in the first opening 140 and the third semiconductor pattern 124 exposed in the third opening 144. Consequently, the electrical connection performance rendered by the second semiconductor pattern 122 and the third semiconductor pattern 124 is improved. On the other hands, the first semiconductor pattern 120, which serves as the active layer for the thin film transistor 126, is protected by the first passivation layer 130, and therefore the first semiconductor pattern 120 suffers no impact. In other words, the electrical performance of the thin film transistor 126 is not influenced by the surface treatment 150.

Figure 6:
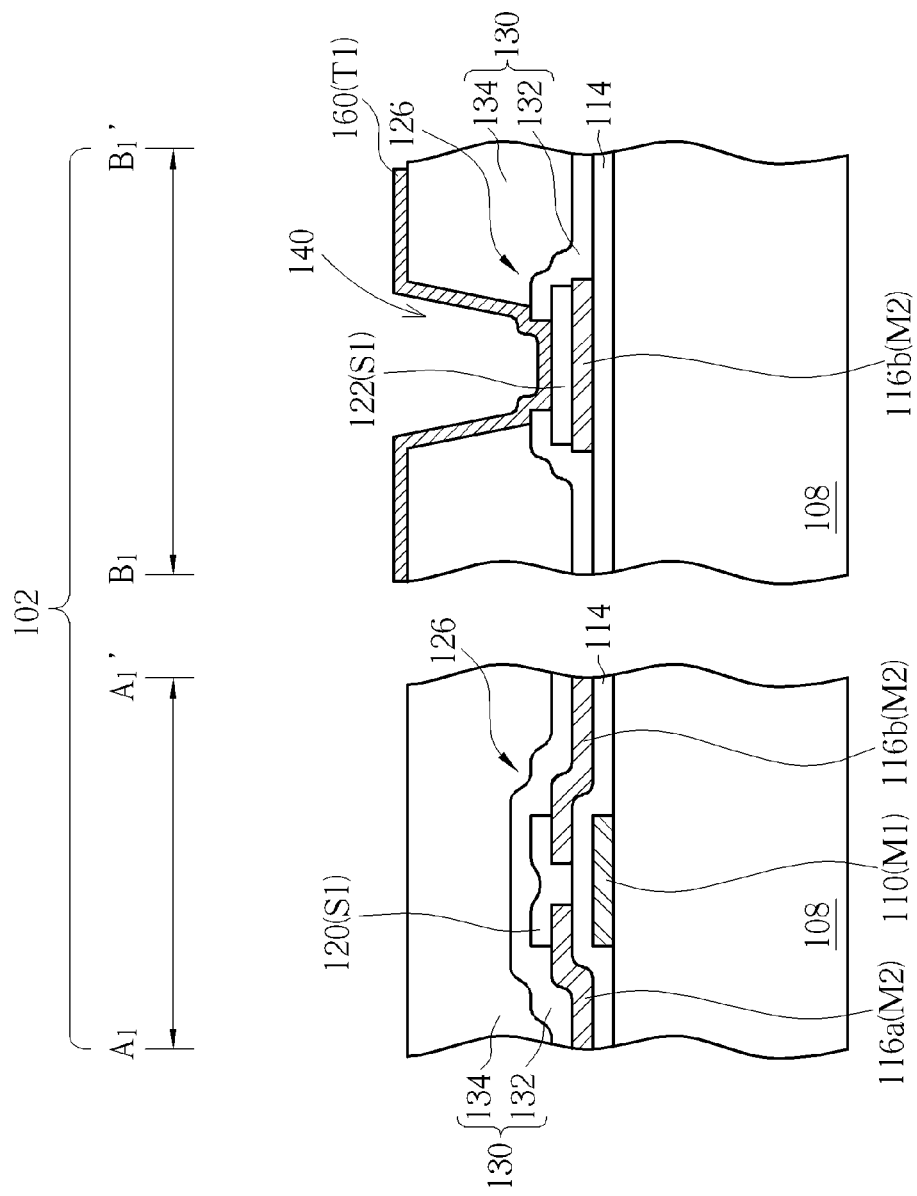
Figure 7:
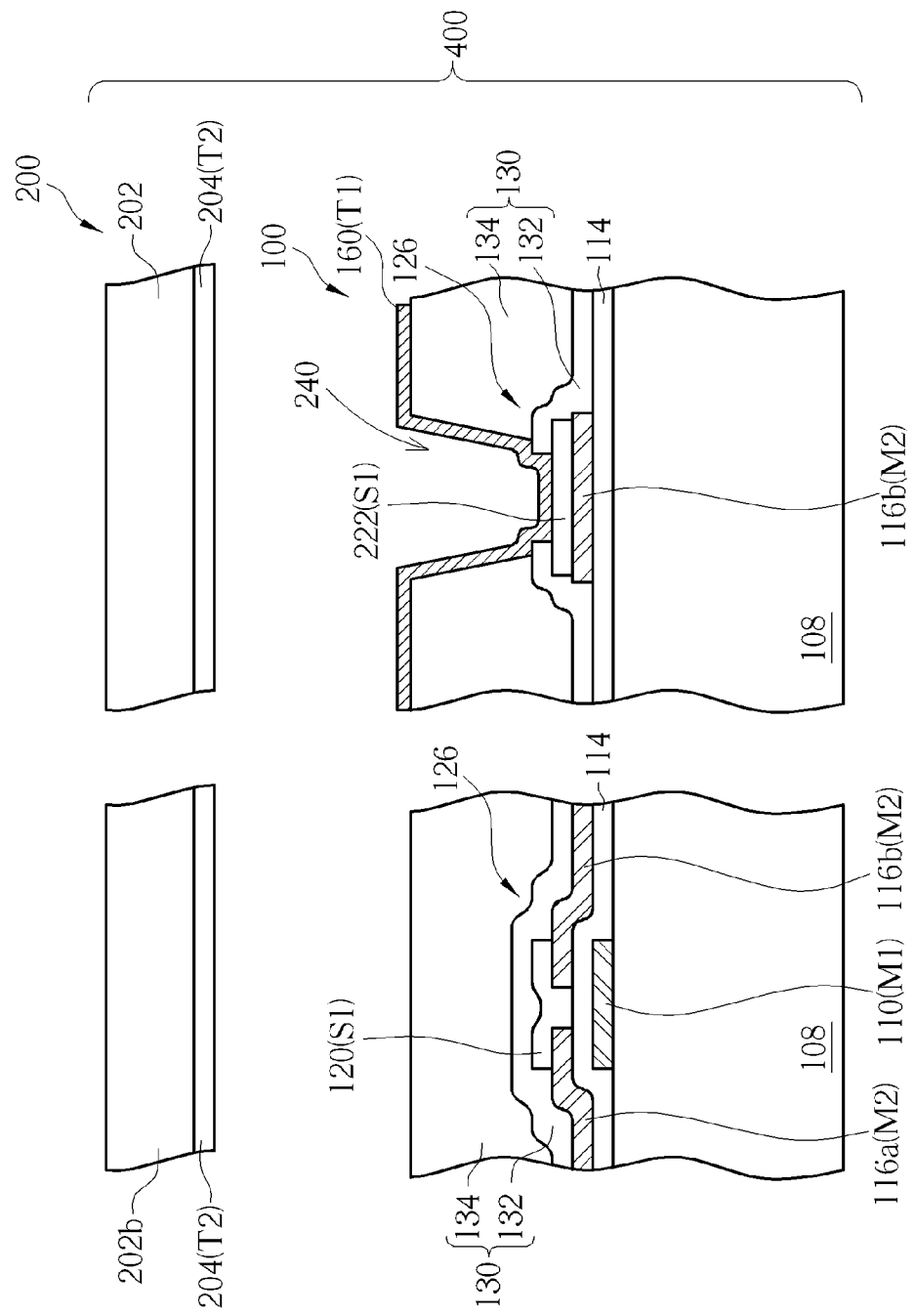

Please refer to FIG. 6 and FIG. 7. It should be noted that for clarifying relationships between the elements in the pixel region 102, the peripheral region 104 is omitted from FIG. 6 and FIG. 7. However, those skilled in the art would easily realize that metal conductive layer(s) or transparent conductive layer(s) can be formed in the third opening 144 in the peripheral region 104 for completing internal or external electrical connection of the connection structure 128 according to different circuit designs, and those details are all omitted herein in the interest of brevity. As shown in FIG. 6, then a first patterned transparent conductive layer T1 is formed on the first passivation layer 130. In this embodiment, the first patterned transparent conductive layer T1 includes a transparent conductive pattern 160, and the transparent conductive pattern 160 serves as a pixel electrode for the pixel structure 106 (shown in FIG. 2). The transparent conductive pattern 160 can be made of indium tin (ITO), but not limited thereto. It is well-known to those skilled in the art that any suitable transparent conductive layer can be used to form the transparent conductive pattern 160. It is noteworthy that the pixel electrode, that is the transparent conductive pattern 160, is electrically connected to the second semiconductor pattern 122 through the first opening 140 and thus electrically connected to the thin film transistor 126. As mentioned above, since the conductivity of the second semiconductor pattern 122 is improved by surface treatment 150, the pixel electrical is successfully electrically connected to the drain electrode 116b through the second semiconductor pattern 122.

Please refer to FIG. 7. According to this embodiment, a color filter array (hereinafter abbreviated as CFA) substrate 200 can be further provided. The CFA substrate 200 exemplarily includes a rigid substrate or a flexible substrate 202. A second patterned transparent conductive layer T2 serving as a common electrode 204 is formed on the substrate 202. A display media layer (not shown) such as liquid crystal layer is sandwiched between the array substrate 100 and the CFA substrate 200 and thus a display panel 400 is constructed.

The array substrate and the manufacturing method thereof provided by the first embodiment utilizes the second semiconductor pattern 122 as the etch stop layer during forming the first opening 140 and as the protection layer for its underneath patterned second metal layer M2 (the drain electrode 116b). Therefore, the drain electrode 116b is protected from any damage during etching the first passivation layer 130. Consequently, the following formed pixel electrode is successfully electrically connected to the drain electrode 116b and thus signals are able to be inputted into the pixel electrode. More important, according to the array substrate and the manufacturing method thereof provided by the first embodiment, not only the drain electrode 116b in the pixel region 102 is protected, but also the connecting layer 118 in the peripheral region 104 is protected. In other words, an etching stop layer (the patterned semiconductor layer S1 including the second semiconductor pattern 122 and the third semiconductor pattern 124) is formed at where openings for exposing the patterned second metal layer M2 are to be formed in accordance with the this embodiment, thus the patterned second metal layer M2 corresponding to the openings is protected from any impact from the etching process.

Figure 8:
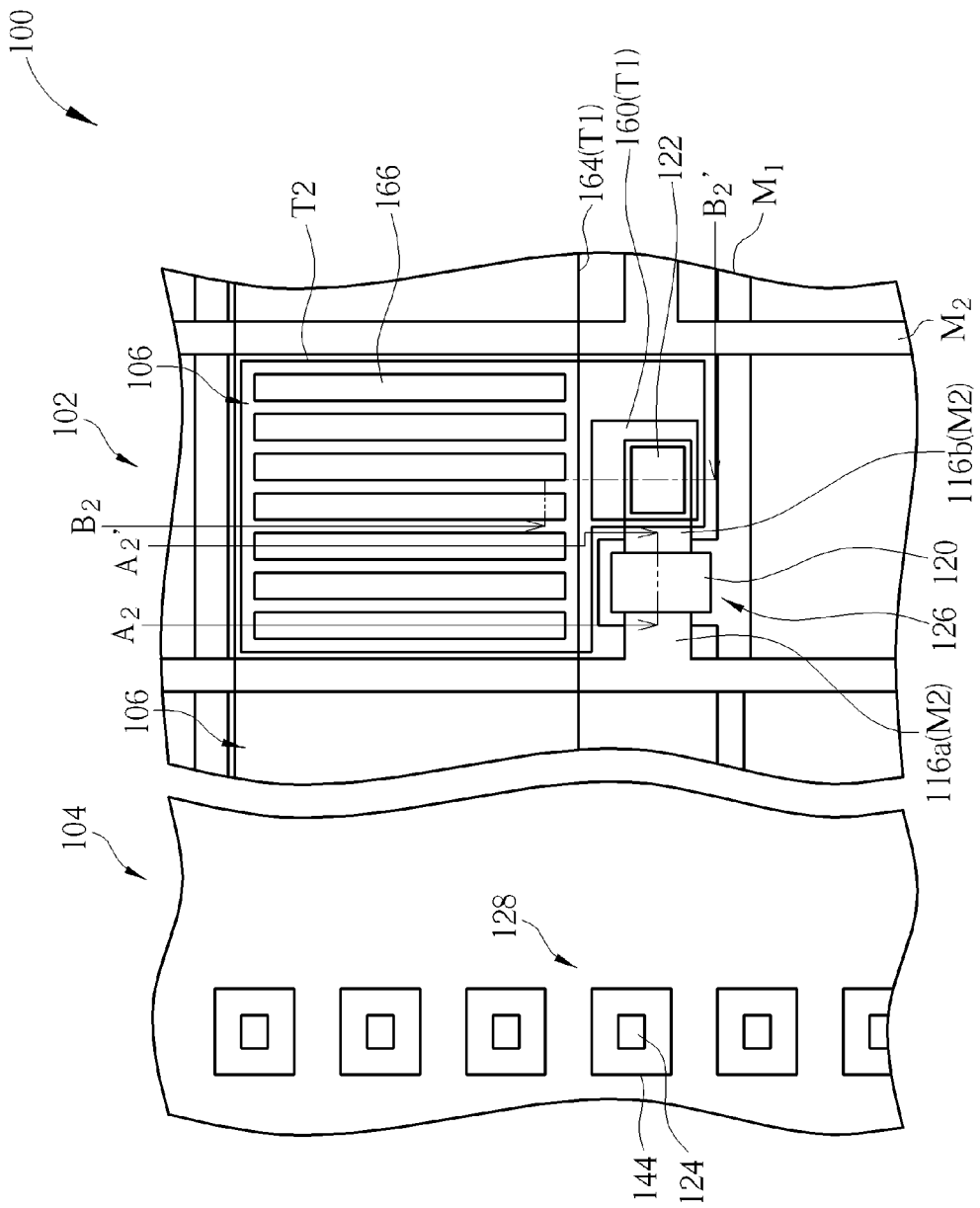
Figure 9:
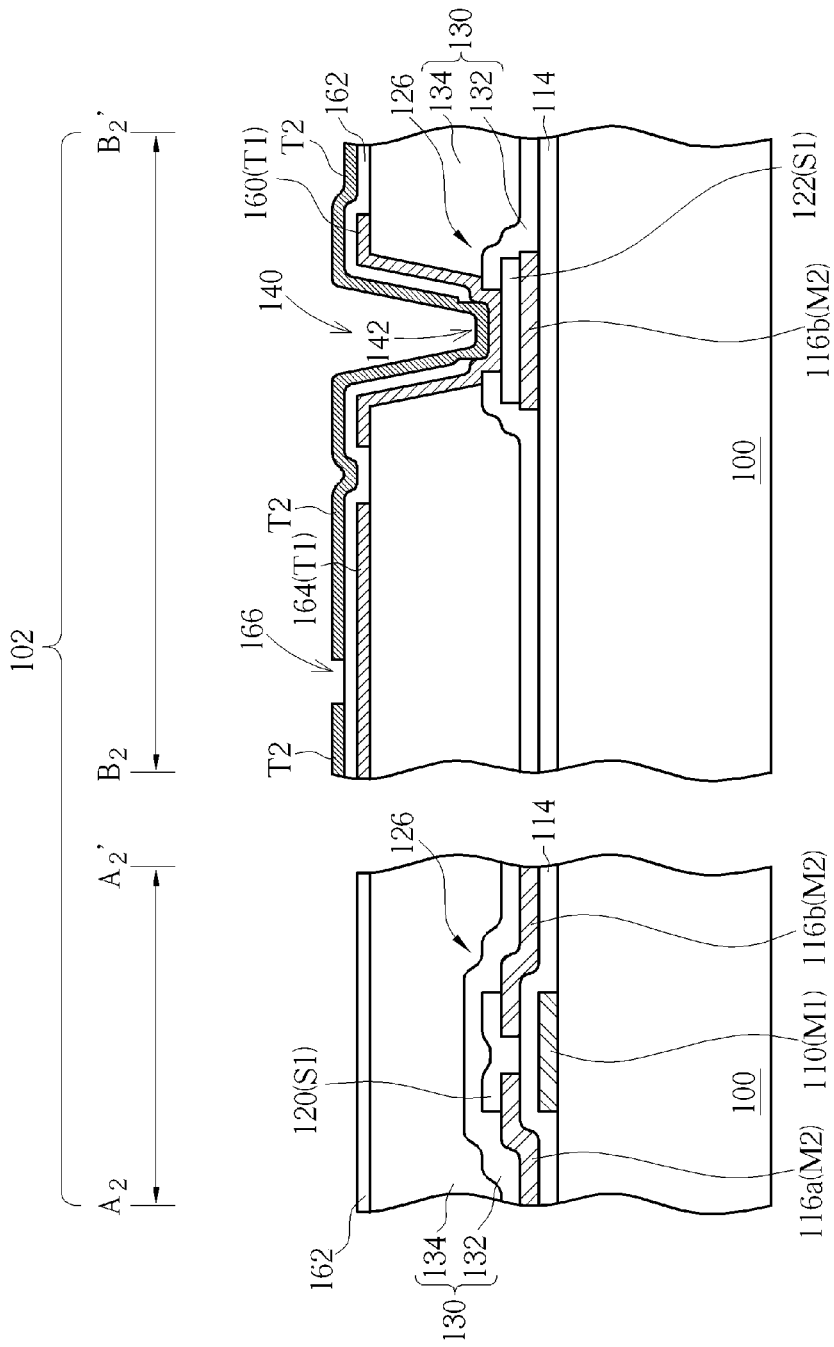

Please refer to FIG. 8 and FIG. 9, which are which are schematic diagrams illustrating an array substrate and a manufacturing method thereof provided by a second embodiment of this disclosure. It should be noted that FIG. 9 is a cross-sectional view taken along lines $A_2$-$A_2'$ and $B_2$-$B_2'$ of FIG. 8. Furthermore, elements the same in the first and second embodiments are designated by the same numerals and can include the same material choice. In order to clearly describe the steps of the present disclosure, FIGS. 3-6 and FIGS. 8-9 should be referred together. It is also noteworthy that details relating to the connection structure 128 in the peripheral region 104 are identical with those described in the first embodiment, and those skilled in the art would easily realize the details according to the above mentioned first embodiment and FIGS. 3-6. Therefore, the details relating to the connection structure 128 in the peripheral region 104 are omitted for simplicity.

Please refer to FIG. 9 subsequent to FIG. 6. It is the same in both of this embodiment and the first embodiment that the thin film transistor 126 is formed in the pixel region 102 of the substrate 108 and the first passivation layer 130 is formed on the thin film transistor 126. Then, the first opening 140 is formed in the first passivation layer 130 to expose a portion of the second semiconductor pattern 122 corresponding to the drain electrode 116b. Next, the first patterned transparent conductive layer T1 is formed on the first passivation layer 130. In this embodiment, the first patterned transparent conductive layer T1 includes a transparent conductive pattern 160 and a common electrode 164. It is noteworthy that the transparent conductive pattern 160 is electrically connected to the second semiconductor pattern 122 through the first opening 140, but the transparent conductive pattern 160 is physically isolated from the common electrode 164.

Please still refer to FIG. 9. Subsequently, a second passivation layer 162 is formed on the first patterned transparent conductive layer T1, and a second opening 142 is formed in the second passivation layer 162 to expose a portion of the transparent conductive pattern 160. Since the second passivation layer 162 and the insulating layer 132 include the same material, a dry etching process with $BCl_3$ and $Cl_2$ can be utilized to etch the second passivation layer 162 for forming the second opening 142. It is noteworthy that during etching the second passivation layer 162, the transparent conductive pattern 160 and the second semiconductor pattern 122 both protect the underneath the patterned second metal layer M2, that is the drain electrode 116b. Therefore the completeness of the drain electrode 116b is still improved even two etching processes are performed in accordance with this embodiment.

Please still refer to FIG. 9. After forming the second passivation layer 162 and the second opening 142, a second patterned transparent conductive layer T2 is formed on the second passivation layer 162. It is noteworthy that the second patterned transparent conductive layer T2 serves as the pixel electrode and is electrically connected to the transparent conductive pattern 160 through the second opening 142, and thus is electrically connected to the second semiconductor pattern 122 in this embodiment. Generally speaking, the second patterned transparent conductive layer T2 and the transparent conductive pattern 160 are taken as a part of the pixel electrode. Furthermore, as shown in FIG. 9, the second patterned transparent conductive layer T2 (that is the pixel electrode) is electrically isolated from the common electrode 164 by the second passivation layer 162. Additionally, the pixel electrode can include a plurality of openings 166, such as slit openings or slits, in this embodiment. As mentioned above, since the conductivity of the second semiconductor pattern 122 is improved by the surface treatment 150, the pixel electrode is successfully electrically connected to the drain electrode 116b through the second semiconductor pattern 122, and thus the pixel structures 106 of the array substrate are obtained. As shown in FIG. 9, at the drain side of the pixel structures 106, a four-layered stack structure of the patterned second metal layer M2/the patterned semiconductor layer S1/the first patterned transparent conductive layer T1/the second patterned transparent conductive layer T2 (that is the drain electrode 116b/the second semiconductor pattern 122/the transparent conductive pattern 160/the pixel electrode) is provided by this embodiment.

The array substrate and the manufacturing method thereof provided by the second embodiment utilizes the second semiconductor pattern 122 and the transparent conductive pattern 160 as the protection layer for the underneath patterned second metal layer M2 (the drain electrode 116b). Therefore, the drain electrode 116b is protected from any damage during etching the first passivation layer 130 and etching the second passivation layer 162. As mentioned above, etching stop layers (including the second semiconductor pattern 122 and the transparent conductive pattern 160) are formed at where openings are required, thus the patterned second metal layer M2 corresponding to the openings is protected from any impact from even two etching processes.

Figure 10:
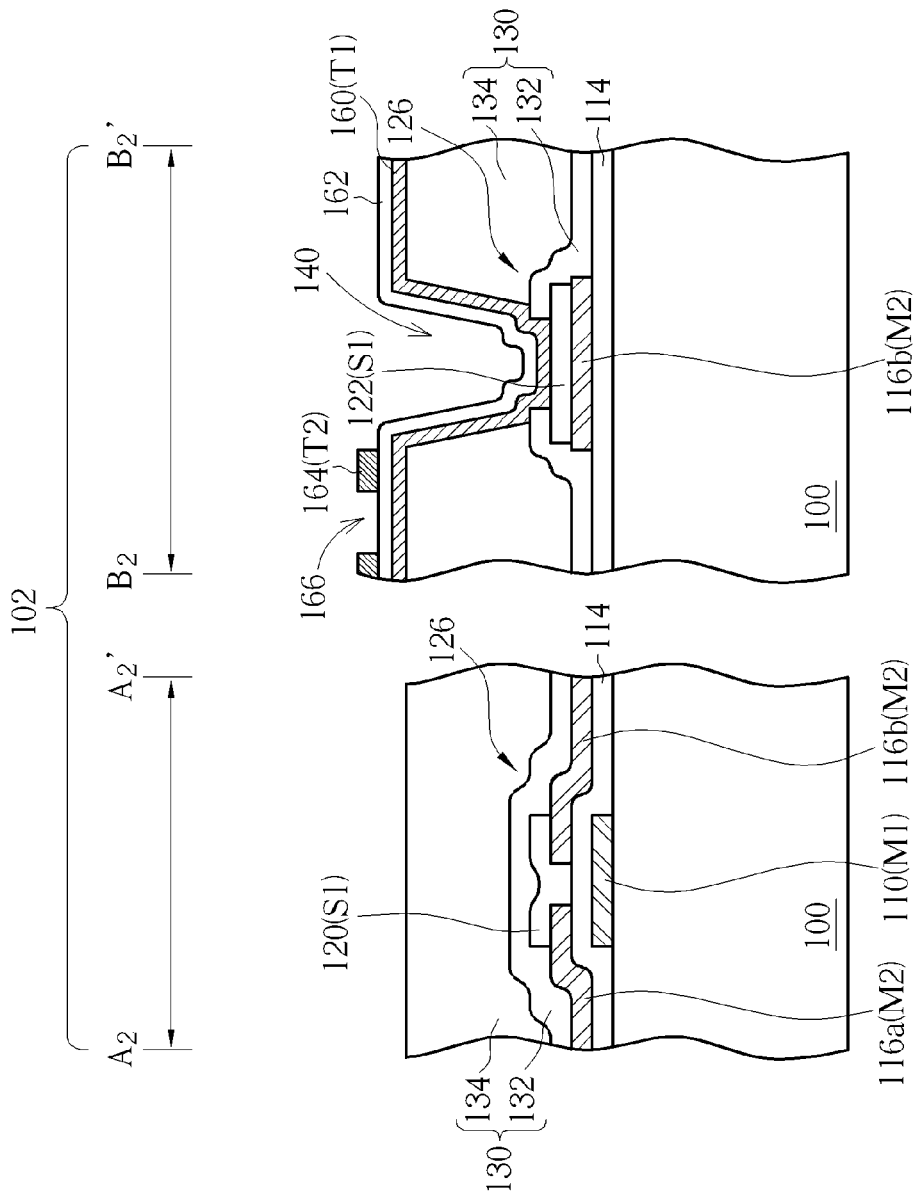
FIG. 10 is a schematic diagram illustrating a manufacturing method thereof provided by a third embodiment of this disclosure.

Please refer to FIG. 10, which is a schematic diagram illustrating a manufacturing method thereof provided by a third embodiment of this disclosure. Furthermore, elements the same in the first and third embodiments are designated by the same numerals and can include the same material choice. It is noteworthy that details relating to the connection structure 128 in the peripheral region 104 are identical with those described in the first embodiment, and those skilled in the art would easily realize the details according to the above mentioned first embodiment and FIGS. 3-6. Therefore, the details relating to the connection structure 128 in the peripheral region 104 are omitted for simplicity.

Please refer to FIG. 10 subsequent to FIG. 6. As mentioned above, the thin film transistor 126 is formed in the pixel region 102 of the substrate 108, and the first passivation layer 130 is formed on the thin film transistor 126. Next, the first opening 140 is formed in the first passivation layer 130 to expose a portion of the second semiconductor pattern 122 corresponding to the drain electrode 116b. Then, as shown in FIG. 10, the first patterned transparent conductive layer T1 is formed on the first passivation layer 130. After forming the first patterned transparent conductive layer T1, the second passivation layer 162 is formed on the first passivation layer 130 and the first patterned transparent conductive layer T1. In this embodiment, the second passivation layer 162 is an insulating layer and can be made of material the same with or different from the insulating layer 132. After forming the second passivation layer 162, a second patterned transparent conductive layer T2 is formed on the second passivation layer 162.

Please still refer to FIG. 10. In this embodiment, the first patterned transparent conductive layer T1 includes the transparent conductive pattern 160, and the transparent conductive pattern 160 serves as the pixel electrode for the pixel structure 106 (shown in FIG. 2). The second patterned transparent conductive layer T2 serves as the common electrode 164, and the common electrode 164 includes a plurality of openings 166 such as slit openings or slits. The second patterned transparent conductive layer T2 can be made of ITO, but not limited thereto. Consequently, the pixel structures 106 and the array substrate 100 are obtained.

Figure 11:
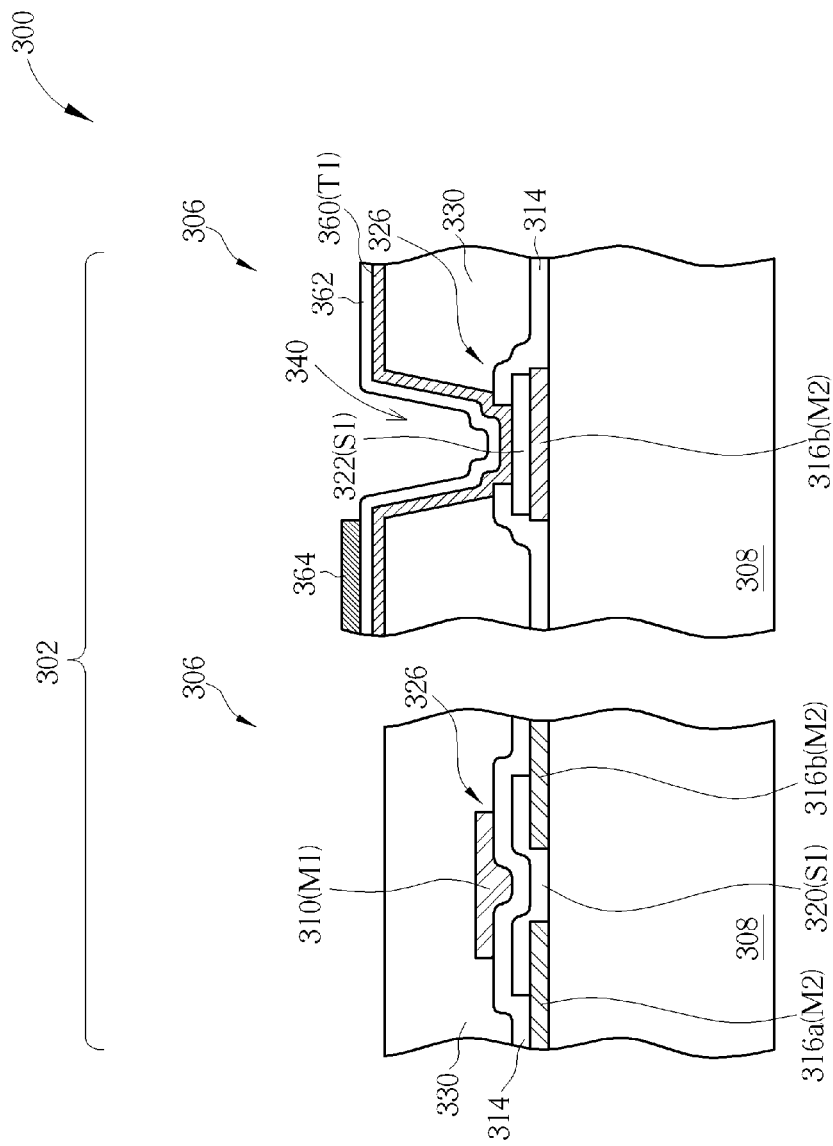
FIG. 11 is a schematic diagram illustrating a manufacturing method thereof provided by a fourth embodiment of this disclosure.

Please refer to FIG. 11, which is a schematic diagram illustrating a manufacturing method thereof provided by a fourth embodiment of this disclosure. Furthermore, elements the same in the first to third embodiments are designated by the same numerals and can include the same material choice. Therefore those details are omitted for simplicity. It is noteworthy that details relating to the connection structure 128 in the peripheral region 104 are identical with those described in the first embodiment, and those skilled in the art would easily realize the details according to the above mentioned first embodiment and FIGS. 3-6. Therefore, the details relating to the connection structure 128 in the peripheral region 104 are omitted for simplicity.

As shown in FIG. 11, a substrate 308 is first provided by this embodiment, and the substrate 308 includes a pixel region 302 and a peripheral region (not shown). A plurality of pixel structures 306 is formed in the pixel region 302. Next, a patterned second metal layer M2 is formed on the substrate 308. The patterned second metal layer M2 includes a source electrode 316a and a drain electrode 316b disposed in the pixel region 302. Subsequently, a patterned semiconductor layer S1 is formed on the substrate 308. As shown in FIG. 11, the patterned semiconductor layer S1 includes a first semiconductor pattern 320 and a second semiconductor pattern 322. The first semiconductor pattern 320 covers a portion of the source electrode 316a and a portion of the drain electrode 316b, and the second semiconductor pattern 322 covers a portion of the drain electrode 316b. It should be noted that the first semiconductor pattern 320 and the second semiconductor pattern 322 are physically spaced apart from each other. In this embodiment, the patterned semiconductor layer S1 can be made of a patterned oxide semiconductor layer, such as IGZO, IZO, IGO, or ZnO, but not limited to this.

Please still refer to FIG. 11. After forming the patterned semiconductor layer S1, a gate insulating layer 314 is formed on the substrate 308 to cover the source electrode 316a, the drain electrode 316b, and the patterned semiconductor layer S1. In this embodiment, the gate insulating layer 314 can be made of aluminum oxide (AlO), but not limited to this. After forming the gate insulating layer 314, a patterned first metal layer M1 is formed on the insulating layer 314. The patterned first metal layer M1 includes a gate electrode 310. Accordingly, at least one thin film transistor 326 is formed in the pixel region 302 of the substrate 308.

Please still refer to FIG. 11. After forming the thin film transistor 326, a first passivation layer 330 is formed on the substrate 308. In this embodiment, the first passivation layer 330 is a single layer such as a planarization layer. However those skilled in the art would easily realize that the first passivation layer 330 can be a multiple layer. Next, an etching process with any suitable etchant is performed to form a first opening 340 in the first passivation layer 330 and the gate insulating layer 314. As shown in FIG. 11, the first opening 340 is formed in the pixel region 302 to expose a portion of the second semiconductor pattern 322. It is noteworthy that during the etching process, the second semiconductor pattern 322 renders protection to its underneath patterned second metal layer M2, that is the drain electrode 316b. Therefore, completeness of the drain electrode 316b is improved. Then, a surface treatment (not shown) is performed to the patterned semiconductor layer S1 for improving conductivity of the second semiconductor pattern 322 exposed in the first opening 340. A first patterned transparent conductive layer T1 is then formed on the first passivation layer 330. In accordance with this embodiment, the first patterned transparent conductive layer T1 includes a transparent conductive pattern 360, and the transparent conductive pattern 360 serves as a pixel electrode for the pixel structure 306. It is noteworthy that the pixel electrode, that is the transparent conductive pattern 360, is electrically connected to the second semiconductor pattern 322 through the first opening 340. As mentioned above, since the conductivity of the second semiconductor pattern 322 is improved by the surface treatment, the pixel electrode is successfully electrically connected to the drain electrode 316b through the second semiconductor pattern 322. After forming the pixel electrode, a second passivation layer 362 is formed on the pixel electrode and the first passivation layer 330, and a common electrode 364 is formed on the second passivation layer 362. Accordingly, the pixel structures 306 and the array substrate 300 are obtained. Additionally, a plurality of openings as mentioned above can be formed in the common electrode 364 depending on the product requirement, but not limited thereto. As shown in FIG. 11, at the drain side of the pixel structures 306, a tri-layered stack structure of the patterned second metal layer M2/the patterned semiconductor layer S1/the first patterned transparent conductive layer T1 (that is the drain electrode 316b/the second semiconductor pattern 322/pixle electrode) is provided by this embodiment.

The array substrate and the manufacturing method thereof provided by the fourth embodiment utilize the second semiconductor pattern 322 as an etching stop layer for its underneath patterned second metal layer M2. Therefore, the drain electrode 316b is protected from any damage during etching the first passivation layer 330 and the gate insulating layer 314. More important, the thin film transistor 326 provided by this embodiment possesses top-gate structure, which is different from the bottom-gate structure provided by the aforementioned embodiments. Accordingly, it is conceivable that the array substrate and the manufacturing method provided by the disclosure can be integrated into any different structure types of thin film transistor and protection to the drain electrode is always rendered in the etching process.

Accordingly, the array substrate and the manufacturing method provided by the disclosure can be integrated into kinds of array substrate in the state-of-the-art. Particularly, when an etch ratio of a dry etchant between a passivation layer and its underneath metal layer is so low that the metal layer is damaged during the etching process, an etch stop layer (the patterned semiconductor layer) is provided by the disclosure and formed at where the openings to be formed. Therefore, the metal layer at where the openings to be formed is protected and its completeness is improved. Consequently, process flexibility, process stability and yield are all efficiently improved by the array substrate and the manufacturing method thereof provided by the disclosure without increasing process cost and duration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an array substrate comprising:
    providing a substrate having a pixel region and a peripheral region adjacent to the pixel region;
    forming a plurality of pixel structures in the pixel region, wherein steps of forming at least one of the pixel structures comprise:
        forming a patterned first metal layer, a gate insulating layer, and a patterned second metal layer on the substrate, wherein the patterned first metal layer comprises a gate electrode, and the patterned second metal layer comprises a source electrode and a drain electrode ;
        forming a patterned semiconductor layer on the substrate, wherein the patterned semiconductor layer comprises a first semiconductor pattern and a second semiconductor pattern, the first semiconductor pattern is substantially corresponding to the gate electrode and covers a portion of the source electrode and a portion of the drain electrode, and the second semiconductor pattern covers a portion of the drain electrode;
        forming a first passivation layer on the substrate, wherein the first passivation layer has a first opening exposing a portion of the second semiconductor pattern; and
        forming a first patterned transparent conductive layer on the first passivation layer, wherein the first patterned transparent conductive layer comprises a transparent conductive pattern, the transparent conductive pattern is electrically connected to the second semiconductor pattern through the first opening.

2. The manufacturing method of the array substrate of claim 1, wherein the patterned semiconductor layer comprises an oxide semiconductor layer.

3. The manufacturing method of the array substrate of claim 1, wherein the first semiconductor pattern and the second semiconductor pattern are physically spaced apart from each other.

4. The manufacturing method of the array substrate of claim 1, wherein the first passivation layer comprises an insulating layer and a planarization layer.

5. The manufacturing method of the array substrate of claim 1, further comprising:
    forming a second passivation layer on the first passivation layer; and
    forming a second patterned transparent conductive layer on the second passivation layer, the second patterned transparent conductive layer having a plurality of openings.

6. The manufacturing method of the array substrate of claim 1, wherein the first patterned transparent conductive layer further comprises a common electrode electrically isolated from the transparent conductive pattern.

7. The manufacturing method of the array substrate of claim 6, further comprising:
   forming a second passivation layer on the first patterned transparent conductive layer;
   forming a second opening exposing a portion of the transparent conductive pattern in the second passivation layer; and
   forming a second patterned transparent conductive layer on the second passivation layer, wherein the second patterned transparent conductive layer is electrically connected to the transparent conductive pattern through the second opening, and the second patterned transparent conductive layer has a plurality of openings.

8. The manufacturing method of the array substrate of claim 1, further comprising performing a surface treatment to the second semiconductor pattern before forming the first patterned transparent conductive layer.

9. The manufacturing method of the array substrate of claim 8, wherein the surface treatment comprises a plasma surface treatment.

10. The manufacturing method of the array substrate of claim 1, wherein the patterned second metal layer further comprises a connecting layer disposed in the peripheral region, the patterned semiconductor layer further comprises a third semiconductor pattern disposed on the connecting layer and covering a portion of the connecting layer, the first passivation layer covers a portion of the third semiconductor pattern, and the first passivation layer further has a third opening exposing a portion of the third semiconductor pattern.

11. The manufacturing method of the array substrate of claim 1, wherein the gate electrode, the first semiconductor pattern, the source electrode, and the drain electrode construct a thin film transistor.

* * * * *